(12) United States Patent
Van Dyne

(10) Patent No.: US 6,258,204 B1
(45) Date of Patent: Jul. 10, 2001

(54) ELECTRICALLY PLANAR UPPER ELECTRODE COVER

(75) Inventor: Christopher D. Van Dyne, Lakehills, TX (US)

(73) Assignee: Philips Semiconductors Inc., Sunnyvale, CA (US)

( * ) Notice: Subject to any disclaimer, the term of this patent is extended or adjusted under 35 U.S.C. 154(b) by 0 days.

(21) Appl. No.: 09/304,142

(22) Filed: May 3, 1999

(51) Int. Cl.[7] ............................. H05H 1/00; C23C 16/00
(52) U.S. Cl. .................. 156/345; 118/723 E; 118/723 R
(58) Field of Search .................. 156/345; 118/723 E, 118/715, 723 R; 204/298.31, 298.39

(56) References Cited

U.S. PATENT DOCUMENTS

| | | | |
|---|---|---|---|
| 4,612,077 | * | 9/1986 | Tracy et al. ........................... 156/345 |
| 5,074,456 | * | 12/1991 | Degner et al. ........................ 156/345 |
| 5,746,875 | * | 5/1998 | Maydan et al. ...................... 156/345 |

\* cited by examiner

*Primary Examiner*—Gregory Mills
*Assistant Examiner*—P. Hassanzadeh
(74) *Attorney, Agent, or Firm*—Oppenheimer Wolff & Donnelly LLP

(57) ABSTRACT

The present invention comprises the electrode assemblies themselves as well as improved plasma plate. The plasma side of the plate is counter bored in the area of the gas inlet holes to an appropriate depth. On the opposite side of the plate, another set of bores are placed around the outsides of the gas inlet feed throughs. These bores are machined to incorporate a set of metallic sleeves. The counter bore on the plasma side of the ceramic is used as the first step in removing the plasma from the ceramic surface. The metallic sleeves are utilized to prevent the plasma from invading the counter bore and touching the surface and to allow the surface to remain electrically uniform and planar to the substrate being etched. The sleeves create a negative charge close to the surface of the ceramic surface but not exposed to the plasma to create a dark space. The dark space mimics an electrically planar surface for the substrate while keeping the hot plasma from direct contact with the ceramic surface.

6 Claims, 6 Drawing Sheets

ELECTRICALLY PLANAR UPPER ELECTRODE COVER

FIELD OF THE INVENTION

The present invention relates generally to the design of electrode covers used for plasma etch and plasma-enhanced chemical vapor deposition reactors. Plasma etching of semiconductor wafers and other substrates relies on the production of ionized gaseous species using a radio frequency (rf) discharge at pressures in the range from about 0.01 to 10 Torr, commonly referred to as a glow discharge. The charged species react with molecules at the surface of the substrate, resulting in volatile reaction products which are carried away. Several types of etchers are commonly employed in semiconductor fabrication including wet chemical (barrel) reactors, vertical dry chemical plasma reactors, and horizontal dry chemical plasma reactors. Of interest herein are dry chemical parallel plate plasma reactors. Such parallel plate reactors are typically characterized by a reactor volume defined by a pair of vertically spaced-apart horizontal electrode plates, although other orientations may also be employed. An etchant gas is typically fed through at least one of the electrode plates, and rf energy is applied across the electrodes to induce the desired plasma. Parallel plate reactors may be configured to process either single or multiple wafers. Single wafer parallel plate reactors, because of their highly symmetric electrical field and gas flow characteristics, are able to provide highly uniform etching across the surface of the wafer. Parallel plate reactors are described in a number of U.S. Pat. Nos. 4,612,077; 4,534,816, 4,595,484, 4,590,042; 4,407,708; and 4,158,589, the disclosures of which are incorporated herein by reference.

Parallel plate plasma reactors usually operate by introducing a low pressure etchant gas through the upper electrode plate and placing a single wafer or multiple wafers over the lower electrode. The plasma is uniformly generated as the etchant gas flows downward and the rf energy is applied to the reactor, typically across the two electrodes.

The upper electrode must meet a number of requirements in order to achieve desired performance characteristics. Foremost, the electrode must have defined electrical properties, such as impedance, current capacity, and the like, in order to couple rf energy into the plasma in combination with the lower electrode. Additionally, the upper electrode material must be able to withstand prolonged exposure to the generated plasma, and interaction between the electrode material and the plasma should not have a deleterious effect on any of the desired plasma properties. In particular, the upper electrode should not generate large particles or large quantities of particles and should not release heavy metals or other contaminants into the zone between the opposed electrodes. Transition group metals severely degrade minority carrier lifetimes and significantly increase junction leakage. Alkali metals, particularly sodium, cause instability in MOS threshold voltages. The temperature characteristics of the plasma are also critical to system performance, and it is desirable that the electrode be able to be maintained at a uniform, stable temperature across its entire surface. Finally, it is often desirable that the etchant gas be introduced through the upper electrode. In that case, the electrode material should be machinable in order to form the necessary passages and other features for delivering a uniform flow of gas therethrough.

Heretofore, upper electrodes for parallel plate plasma reactors have generally been formed from a single (or coated) material, such as polycrystalline silicon, graphite, aluminum, flame sprayed silicon powder on aluminum, or the like. While each of these materials enjoys certain advantages, e.g. polycrystalline silicon is compatible with many plasma chemistries, anodized aluminum is relatively inexpensive and easy to fabricate, and graphite is readily machined and can be purified to semiconductor purity, no one material has been found to meet all electrode requirements.

Thus, it would be desirable to provide improved electrode cover constructions used in plasma etching. Such electrode covers should possess desirable electrical and thermal properties, and should be compatible with many or all plasma chemistries. In particular, it would be desirable if such electrodes were relatively easy and inexpensive to fabricate.

SUMMARY OF THE INVENTION

According to the present invention, an electrode assembly suitable for use in a plasma etcher comprises a plate, usually in the form of a disk, composed of a "semiconductor purity" material having a substantially uniform thickness. One face of the plate is bonded to a support frame composed of an electrically and thermally conductive material, leaving the other face substantially flat and free from protuberances. Usually, the support frame will be in the form of a ring which is bonded about the periphery of a plate in the form of a disk. Preferably, a plate and support frame are bonded together with a relatively ductile bonding layer formed by brazing, soldering, or the like. The bonding material should be composed of a thermally and electrically conductive material, such as metals, conductive epoxies, or the like preferably being formed from low vapor pressure materials which will have less tendency to contaminate low pressure reactor environments.

The present invention comprises the electrode assemblies themselves as well as improved plasma plate. The plasma side of the plate is counter bored in the area of the gas inlet holes to an appropriate depth. On the opposite side of the plate, another set of bores are placed around the outsides of the gas inlet feed throughs. These bores are machined to incorporate a set of metallic sleeves. The counter bore on the plasma side of the ceramic is used as the first step in removing the plasma from the ceramic surface. The metallic sleeves are utilized to prevent the plasma from invading the counter bore and touching the surface and to allow the surface to remain electrically uniform and planar to the substrate being etched. The sleeves create a negative charge close to the surface of the ceramic surface but not exposed to the plasma to create a dark space. The dark space mimics an electrically planar surface for the substrate while keeping the hot plasma from direct contact with the ceramic surface.

The plate portion of the composite electrode which is exposed to plasma can be formed from material which is most suitable for the processing conditions with less concern for the cost of the material or the ability to machine the material. Thus, the material of choice can be dictated primarily by plasma chemistry and the desirability to minimize formation of particles and release of other contaminates. Similarly, the support frame can be composed of a material which has desired electrical, thermal, and structural properties and which can be relatively easily machined or otherwise formed into a desired geometry, e.g. a ring. In particular, the material of the support frame should not be brittle and should allow attachment within the reactor by bolting or other conventional fasteners. The material of the support frame will usually be chosen to have a thermal expansion coefficient which is generally compatible with that of the electrode plate, but a certain amount of mismatch can be tolerated when the bonding layer is formed from a ductile material. In a preferred embodiment, the support frame is chosen to have a slightly greater coefficient of thermal expansion. By then joining and/or curing the bonding layer at a temperature above the expected operating temperature of the electrode, the electrode plate will be maintained under compression, enhancing the durability of the plate. In this way, the support frame can be reliably connected to an electrical power source as well as a heat sink intended to control the temperature of the electrode. By properly configuring the contact area between the support frame and the electrode plate, the rf fields produced by the electrode as well as the temperature profile maintained across the electrode can be maintained within desired parameters.

Other aspects and advantages of the invention will become apparent from the following detailed description, taken in conjunction with the accompanying drawing, illustrating by way of example the principles of the invention.

DESCRIPTION OF THE DRAWINGS

The foregoing and other objects, aspects and advantages are better understood from the following detailed description of a preferred embodiment of the invention with reference to the drawings, in which.

DETAILED DESCRIPTION

An improved apparatus for manufacturing silicon wafer is presented. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

The objectives of the semiconductor industry are to continually improve the performance of silicon devices, while maintaining or decreasing the cost of these devices. The ability to manufacture silicon chips, exhibiting sub-micron features, have in part, allowed the performance and cost objectives to be realized. For example silicon devices, fabricated with specific sub-micron features, result in larger decreases in performance degrading resistance and capacitance, than counterparts fabricated using less aggressive designs. In addition the ability to produce smaller silicon chips, due to the use of smaller features, allows more chips to be produced from a specific size starting silicon substrate. Since the processing cost for the silicon substrate remains the same, the cost of an individual silicon chip is reduced.

The use of sub-micron features, or the trend to microminiaturization, has been achieved as a result of advances or development of several semiconductor fabrication disciplines, such as photolithography, and dry etching. The use of more sophisticated exposure cameras, as well as the development of more sensitive photoresist materials, have allowed sub-micron images to be routinely produced in photoresist layers. In addition the development of selective, anisotropic, dry etching processes, have allowed these sub-micron images in photoresist layers, to be successfully transferred to underlying materials, used for the fabrication of advanced silicon devices.

Figure 1A:
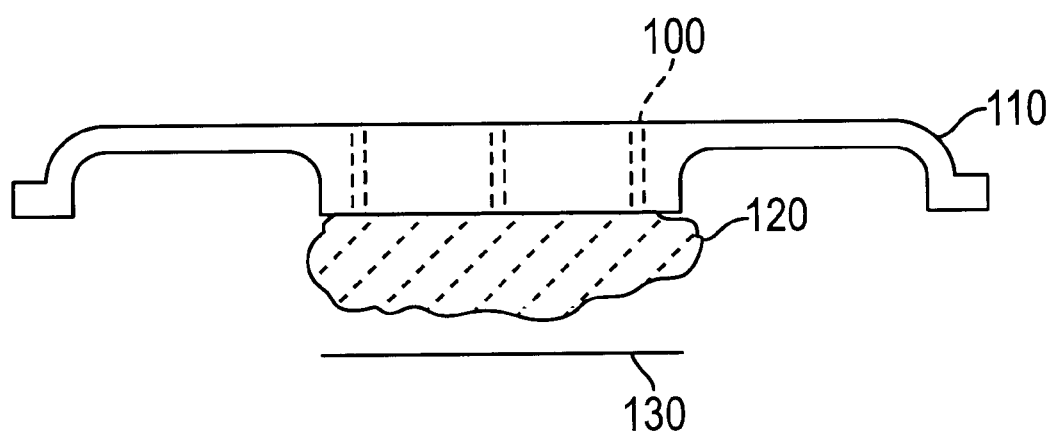
FIG. 1A and FIG. 1B are diagrams of prior art plasma etchers.
Figure 1B:
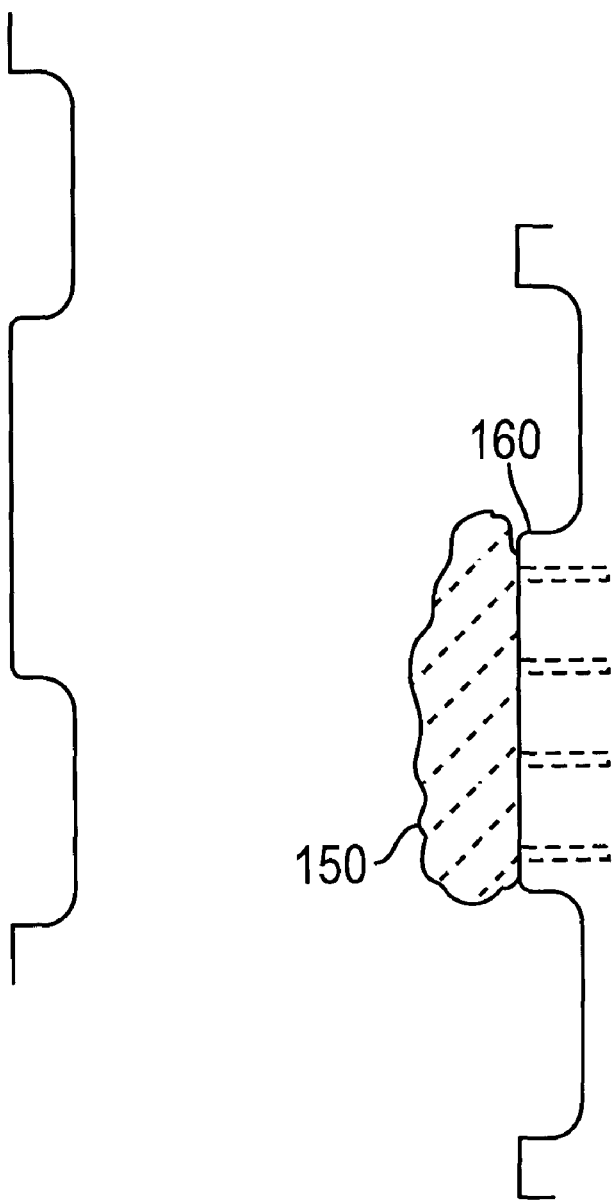

A preferred embodiment provides an improved construction for an electrode cover assembly useful particularly in plasma etchers. Such etchers typically include upper and lower electrodes where the upper electrode is mounted in an electrode plate which is capable of moving up and down relative to the lower electrode. The lower electrode which is generally fixed, will serve as a support service or "chuck" for the semiconductor wafer or other article which is being treated. FIG. 1A illustrates a prior art plasma etcher. The plasma 120 is suspended above the substrate 130 by an electrode plate 110 permeated by gas inlets 100. FIG. 1B illustrates plasma 150 attacking a surface resulting in flakes falling on the substrate surface 160.

The electrode assembly of the present invention comprises a generally flat plate, usually in the form of a disk having a substantially uniform thickness thereacross, which is composed of a material which is "semiconductor pure". Semiconductor purity means that the material is at least 99.999% pure and is substantially free of trace contaminants that could interfere with the associated wafer fabrication process. In particular, the material should have a total ash content of less than 10 parts per million (ppm) including minimal amounts of heavy metal, transition group metal, and alkali contaminants which are particularly damaging to silicon device performance.

The plate will provide an electrode surface that is exposed to the plasma in the parallel plate or other reactor. Thus, the plate will be composed of a particular semiconductor pure material that is selected to be compatible with the plasma chemistry being performed in the reactor. Etching is typically performed with halogen-based chemistries, and the materials listed in Table 1 below are generally suitable for most such chemistries. This listing is not meant to be comprehensive and other electrode materials and plasma chemistries may also be used in the present invention.

TABLE 1

Graphite
Polycrystalline silicon
Quartz
Glassy carbon
Single crystal silicon
Pyrolytic graphite
Silicon carbide
Alumina
Zirconium
Diamond-coated materials
Titanium oxide The thickness and other dimensions of the electrode plate are not critical and will be selected based on the dimensions of the etcher, cost of the material, machinability of the material, material erosion rate, and the like. Usually, however, for expensive material it will be desirable to minimize the thickness of the electrode plate while providing sufficient material to permit extended use before thinning of the material requires replacement. Most commonly, the plate will be in the form of a disc having a diameter in the range from about 12 cm to 32 cm, usually being in the range from about 15 cm to 25 cm. The thickness of the plate will be in the range from about 0.1 cm to 2 cm, usually being in the range from about 0.3 cm to 1 cm.

The geometry of the electrode plate will generally be symmetric and relatively simple in order to enhance uniform electrical and thermal characteristics as well as minimize stresses which might occur during machining, mounting, and/or use of the electrode. The most preferred geometry is a round disk. The plate will generally be flat and free from protuberances, but the upper face may have ridges, shoulders, or other symmetric features. In particular, a peripheral shoulder may be provided to facilitate connection to a support ring, as described below. The exposed face of the electrode plate will be free from protuberances and it will usually be desirable to form apertures or orifices through the plate in order to facilitate introduction of reactant gases into the reactor volume. Such apertures will generally be chosen to have symmetrical characteristics, usually having a circular profile, and will be typically laid out in a uniform, symmetric pattern which will minimize nonuniformities in the thermal, electrical, and structural properties of the disk.

The electrode assembly of the present invention further comprises a support frame which is bonded to one face or surface of the electrode plate. The support frame provides mechanical support for the electrode plate when mounted in the reactor electrode plate, as discussed hereinafter. Additionally, the support frame will provide electrical and thermal connection of the electrode plate to the rf source and heat sink provided within the reactor. Thus, the support frame is preferably formed from a material having high electrical and thermal conductivities. By electrical conductivity, of course, it is meant the materials should have a low impedance within the rf range of interest, typically either about 400 kHz or about 13 MHz. The material of the support frame should be readily machinable so that the support frame can be shaped to be compatible with mounting of the electrode assembly in a wide variety of parallel plate and other reactor systems. Suitable materials for this support frame include graphite, aluminum, copper, stainless steel, and the like.

The support frame may assume virtually any geometry, but will preferably have a symmetric geometry corresponding to that of the electrode plate, i.e., usually having a circular symmetry in order to enhance uniform thermal, electrical, and structural characteristics in the electrode assembly during use. In the case of circular electrode plates, i.e. disks, the support frame will typically be an annular ring (or include a plurality of concentric annular rings) which is bonded about the periphery of one face of surface of the electrode plate. As described in more detail hereinafter with reference to the drawings, the use of the annular ring defines a region for receiving etchant gases which are then passed through the apertures or orifices, when present in the electrode plate. Alternatively, the support frame could itself be a disk having apertures aligned with the apertures in the electrode plate (if any) to allow introduction of reactant gases.

According to the present invention, an electrode assembly suitable for use in a plasma etcher comprises a plate, usually in the form of a disk, composed of a "semiconductor purity" material having a substantially uniform thickness. One face of the plate is bonded to a support frame composed of an electrically and thermally conductive material, leaving the other face substantially flat and free from protuberances. Usually, the support frame will be in the form of a ring that is bonded about the periphery of a plate in the form of a disk. Preferably, plate and support frames are bonded together with a relatively ductile bonding layer formed by brazing, soldering, or the like. The bonding material should be composed of a thermally and electrically conductive material, such as metals, conductive epoxies, or the like preferably being formed from low vapor pressure materials which will have less tendency to contaminate low pressure reactor environments.

A preferred embodiment in accordance with the present invention comprises the electrode assemblies themselves as well as improved plasma plate. The plasma side of the plate is counter bored in the area of the gas inlet holes to an appropriate depth. On the opposite side of the plate, another set of bores are placed around the outsides of the gas inlet feed throughs.

These bores are machined to incorporate a set of metallic sleeves. The counter bore on the plasma side of the ceramic is used as the first step in removing the plasma from the ceramic surface. The metallic sleeves are utilized to prevent the plasma from invading the counter bore and touching the surface and to allow the surface to remain electrically uniform and and planar to the substrate being etched. The sleeves create a negative charge close to the surface of the ceramic surface but not exposed to the plasma to create a dark space. The dark space mimics an electrically planar surface for the substrate while keeping the hot plasma from direct contact with the ceramic surface.

The plate portion of the composite electrode which is exposed to plasma can be formed from material which is most suitable for the processing conditions with less concern for the cost of the material or the ability to machine the material. Thus, primarily plasma chemistry and the desirability to minimize formation of particles can dictate the material of choice and release of other contaminates. Similarly, the support frame can be composed of a material which has desired electrical, thermal, and structural properties and which can be relatively easily machined or otherwise formed into a desired geometry, e.g. a ring. In particular, the material of the support frame should not be brittle and should allow attachment within the reactor by bolting or other conventional fasteners. The material of the support frame will usually be chosen to have a thermal expansion coefficient which is generally compatible with that of the electrode plate, but a certain amount of mismatch can be tolerated when the bonding layer is formed from a ductile material. In a preferred embodiment, the support frame is chosen to have a slightly greater coefficient of thermal expansion.

By then joining and/or curing the bonding layer at a temperature above the expected operating temperature of the electrode, the electrode plate will be maintained under compression, enhancing the durability of the plate. In this way, the support frame can be reliably connected to an electrical power source as well as a heat sink intended to control the temperature of the electrode. By properly configuring the contact area between the support frame and the electrode plate, the rf fields produced by the electrode as well as the temperature profile maintained across the electrode can be maintained within desired parameters.

Figure 2A:
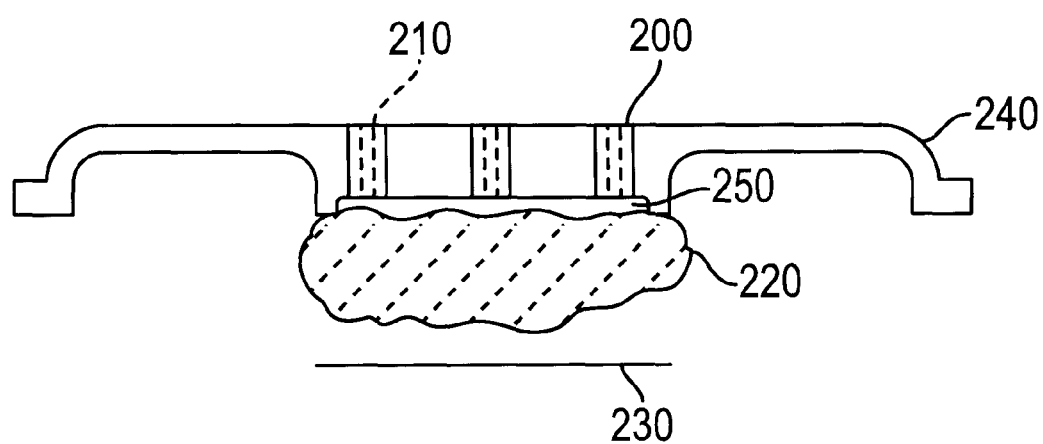
FIG. 2A–2C are illustrations of plasma etchers in accordance with preferred embodiments.

FIG. 2A is a plasma etcher in accordance with a preferred embodiment. A metallic sleeve or coil 200 is placed around all ceramic holes to create a negative charge close to the surface of the ceramic surface 250 but away from the plasma 220. The substrate is also kept from direct contact with the plasma 220. A positive charge forms in the resultant space 250 between the plasma 220 and the electrode plate 240.

Figure 2B:
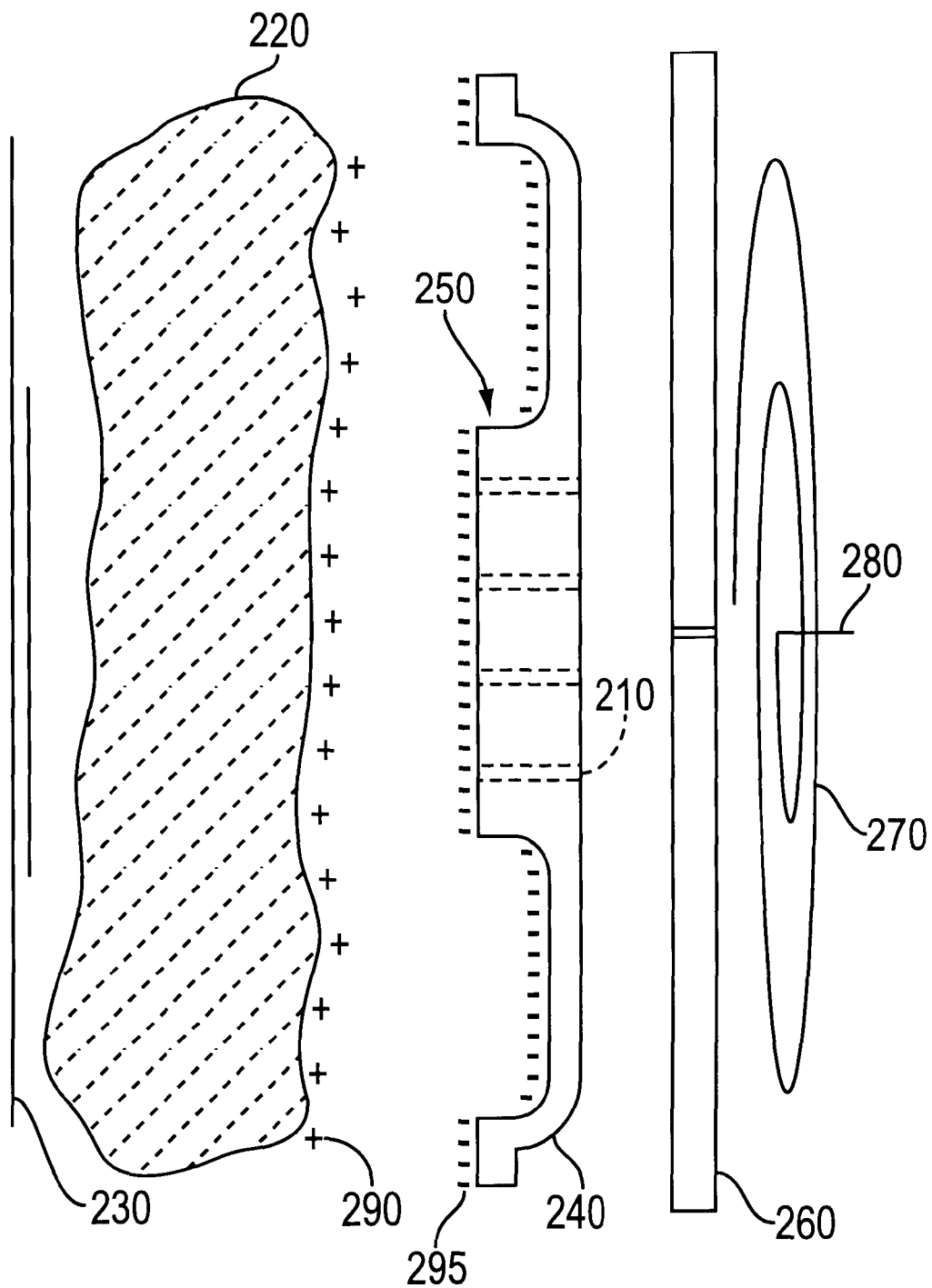

FIG. 2B illustrates a plasma etcher's electrical configuration in accordance with a preferred embodiment. Since the components are geometrically arranged as a pair of parallel plates, a capacitor is formed. Further, since real power is being absorbed, there must also be a resistor involved.

Figure 2C:
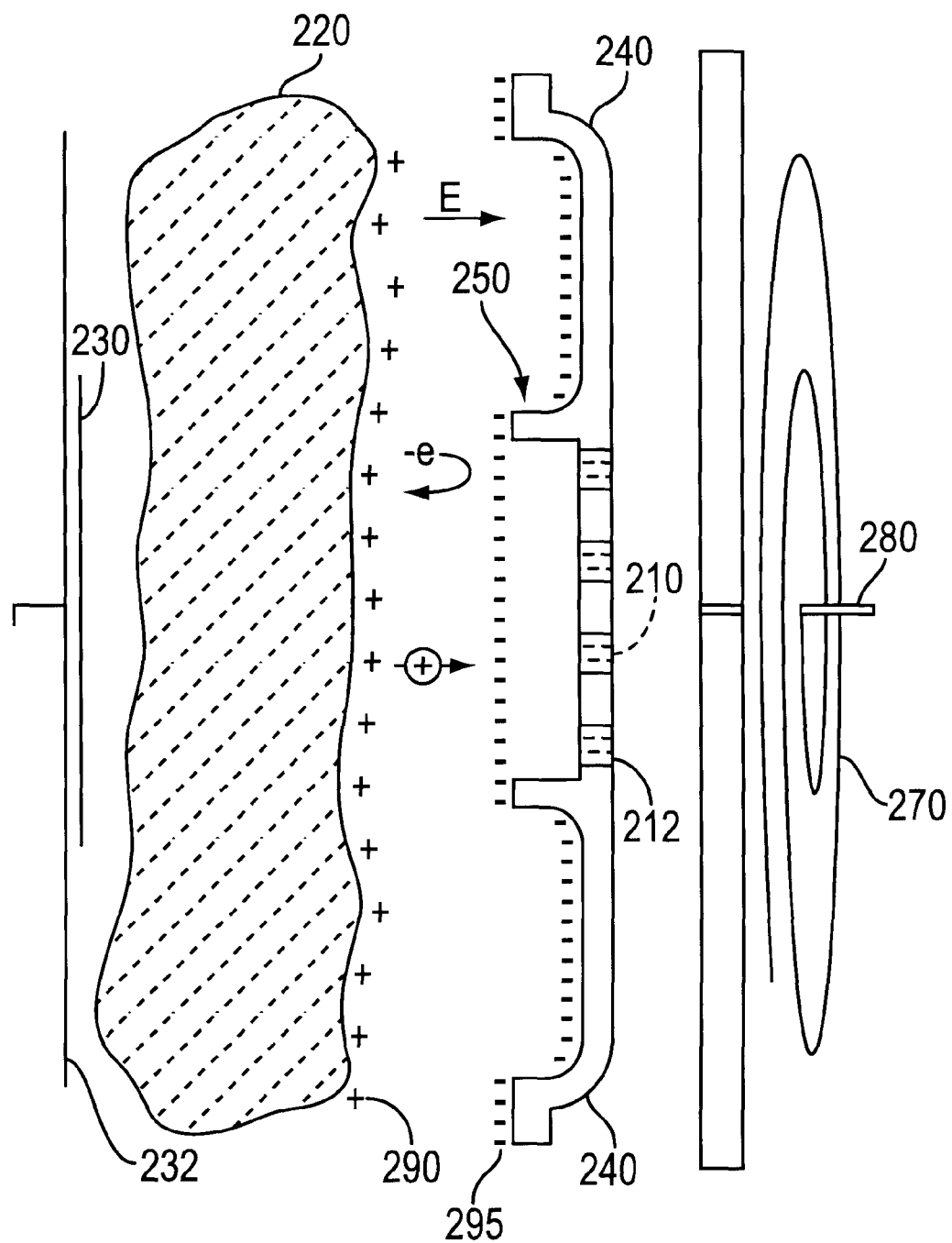

Investigators in the field have gone to great lengths to analytically derive a more detailed circuit, but for our purposes, the circuit can best be considered as a capacitor and a resistor in series. There is however, one more detail that must be explored. That is the appearance of a DC bias whenever the RF structure in the chamber is not symmetrical. This situation arises in the etch chamber whereas it does not in the CVD chamber because it has parallel surfaces that are roughly equal in area 230 and 240. An RF source 280 creates a voltage on a TCP coil 270 which is propagated on the electrode plate 240 as a negative charge 295. This charge attracts the plasma 220 with its positive charge 290. The dark space 250 and DC bias will be more fully detailed now. If a metallic plate is inserted into the plasma as illustrated in FIG. 2C at 212, it will quickly become negatively charged because the rapidly moving electrons 295 will strike the metal more frequently than the slow moving positive ions 290. After a certain amount of negative charge has accumulated on the metal plate, electrons in the plasma will be repelled from the plate and the region around the plate will contain only a positive ionic charge.

Without the presence of electrons in this region there can be no excited atoms, and therefore no glow. This region of positive ionic charge is known as the sheath or dark space 250. It always occurs between the plasma 220 and any metal wall or electrode 240 that confines the plasma. The positive ions in the sheath 290 and the electrons accumulated on the metallic plate 295 create a potential drop between the plasma 220 and the metal 240 referred to as the sheath potential. Also there is a negative DC voltage which builds up and attracts positive particles. Positive particles are accelerated through the sheath striking a surface nominally at ninety degrees. This is extremely important in an etch process because only vertical etching is desired for extremely small geometry.

Figure 3:
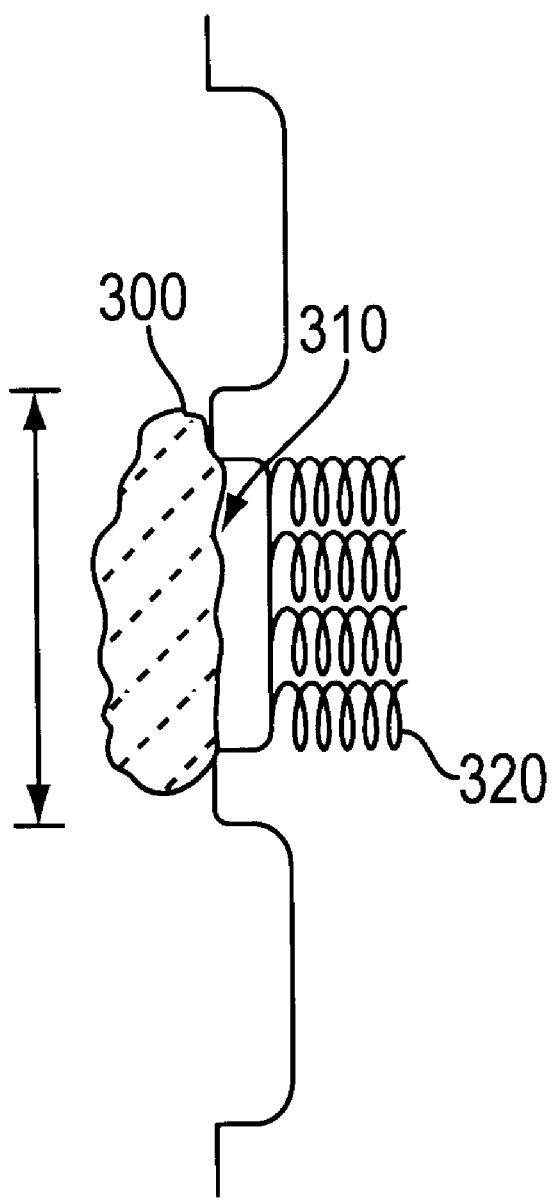
FIG. 3 is a detailed illustration of a plasma etcher in accordance with a preferred embodiment.

FIG. 3 is a detailed illustration of a plasma etcher in accordance with a preferred embodiment. A dark space 310 is created by metallic encased ceramic holes 320 that make the electrode surface appear to be planar to the plasma 300 without damaging the gas inlet ceramic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. An improved plasma etcher of the type having a first electrode for supporting a substrate, an opposed electrode, and means for producing a plasma therebetween, said opposed electrode having a first side facing said first electrode and an opposite side connected to an electrical source and a thermal sink, said first side of said opposed electrode having a counterbore therein defining a recessed first surface, and said opposed electrode having a plurality of apertures therethrough opening on said first surface, said opposite side of said opposed electrode having an annular counterbore surrounding each of at least some of said apertures, said annular counterbores opening on said opposite surface and not opening on said first surface, each said annular counterbores having a metallic sleeve therein.

2. An improved plasma etcher as recited in claim 1, wherein said apertures are configured to permit flow of a reactant gas into the space between the electrodes.

3. An improved plasma etcher as recited in claim 1, wherein the opposed electrode is bonded to a support frame by means of a bonding layer.

4. An improved plasma etcher as recited in claim 3, wherein the bonding layer comprises a material having a low vapor pressure.

5. An improved plasma etcher as recited in claim 4, wherein the bonding layer material is selected from the group consisting of indium, silver, and metal-filled epoxies.

6. An improved plasma etcher as recited in claim 1, wherein the opposed electrode is composed of a pure material selected from the group consisting of graphite, polycrystalline silicon, quartz, glassy carbon, single crystal silicon, pyrolytic graphite, silicon carbide, alumina, zirconium, diamond-coated materials, and titanium oxides.

* * * * *